US007906725B2

(12) United States Patent
Shimoi et al.

(10) Patent No.: US 7,906,725 B2
(45) Date of Patent: Mar. 15, 2011

(54) VACUUM DEVICE

(75) Inventors: Hideki Shimoi, Hamamatsu (JP); Hiroyuki Sugiyama, Hamamatsu (JP); Hiroyuki Kyushima, Hamamatsu (JP)

(73) Assignee: Hamamatsu Photonics K. K., Hamamatsu-shi, Shizuoka (JP)

( * ) Notice: Subject to any disclaimer, the term of this patent is extended or adjusted under 35 U.S.C. 154(b) by 511 days.

(21) Appl. No.: 11/922,029

(22) PCT Filed: Jun. 28, 2006

(86) PCT No.: PCT/JP2006/312901

§ 371 (c)(1), (2), (4) Date: Dec. 12, 2007

(87) PCT Pub. No.: WO2007/020752

PCT Pub. Date: Feb. 22, 2007

(65) Prior Publication Data

US 2009/0283290 A1 Nov. 19, 2009

(30) Foreign Application Priority Data

Aug. 12, 2005 (JP) ................................ P2005-234112

(51) Int. Cl.
*H05K 5/06* (2006.01)

(52) U.S. Cl. ..................... 174/50.5; 174/50.54; 174/520; 250/207; 313/544; 313/532

(58) Field of Classification Search ................. 174/50.5, 174/50.53, 50.54, 520, 559; 313/544, 532, 313/103 CM, 523, 541, 542; 250/207
See application file for complete search history.

(56) References Cited

U.S. PATENT DOCUMENTS

| | | | | |
|---|---|---|---|---|
| 5,264,693 | A | 11/1993 | Shimabukuro et al. | |
| 5,329,110 | A | 7/1994 | Shimabukuro et al. | |
| 5,568,013 | A | 10/1996 | Then et al. | |
| 6,020,684 | A | 2/2000 | Negi et al. | |
| 7,049,747 | B1 | 5/2006 | Goodberlet et al. | |
| 7,189,956 | B2 * | 3/2007 | Shimoi et al. | 250/207 |
| 7,294,954 | B2 | 11/2007 | Syms | |
| 7,602,122 | B2 * | 10/2009 | Kyushima et al. | 313/532 |
| 7,741,759 | B2 * | 6/2010 | Sugiyama et al. | 250/207 |

FOREIGN PATENT DOCUMENTS

| | | |
|---|---|---|
| JP | 10-208689 | 8/1998 |
| JP | 2000-82401 | 3/2000 |
| JP | 2000-323593 | 11/2000 |
| JP | 2002-352713 | 12/2002 |

* cited by examiner

*Primary Examiner* — Angel R Estrada
(74) *Attorney, Agent, or Firm* — Drinker Biddle & Reath LLP

(57) ABSTRACT

An object is to sufficiently keep the airtightness in a vacuum container even when it is made smaller. A photomultiplier tube 1 comprises a flat sheet-like lower substrate 4, a casing-like frame **3*b* erected on the lower substrate 4, an upper substrate 2 including a frame 3*a* airtightly joined to an opening part of the frame 3*b* while holding a low-melting metal therebetween, and a frame-like projection 25*b* arranged in parallel with the frame 3*b* on the inner side of the frame 3*b* on the lower substrate 4**.

11 Claims, 8 Drawing Sheets

(a)

(b)

(a)

(b)

VACUUM DEVICE

TECHNICAL FIELD

The present invention relates to a vacuum device having a vacuum-sealed package, a sealing structure of the package in the vacuum device in particular.

BACKGROUND ART

Vacuum devices having vacuum-sealed vacuum containers such as electron tubes, CRTs, and the like have conventionally been known. An example of such vacuum devices is an image display apparatus described in the following Patent Document 1. This image display apparatus has a vacuum container in which a front faceplate and a back faceplate are joined to each other by a seal material.

Patent Document 1: Japanese Patent Application Laid-Open No. 2002-352713

DISCLOSURE OF THE INVENTION

Problem to be Solved by the Invention

Meanwhile, as vacuum devices such as photosensors typified by photomultiplier tubes have recently been becoming versatile, the demand for reducing the size of vacuum devices has been growing. However, the joint surface formed by the seal material cannot be made so large as compared with the total faceplate area in the structure of the vacuum container in the above-mentioned image display apparatus, whereby the sealing may become incomplete when reducing the size of the device in particular.

Therefore, in view of such a problem, it is an object of the present invention to provide a vacuum device which can sufficiently keep the airtightness in a vacuum container even when made smaller.

Means for Solving Problem

For solving the above-mentioned problem, the vacuum device of the present invention comprises a flat sheet-like substrate, a frame-like side wall erected on the substrate, a lid member airtightly joined to an opening part of the side wall while holding a low-melting metal therebetween, and a frame-like projection arranged in parallel with the side wall on the inner side of the side wall on the substrate. The vacuum device herein refers to an electronic device in which the inside of its package is in a vacuum state or a specific gas is sealed within the package.

In such a vacuum device, the opening part of the side wall erected on the flat sheet-like substrate and the lid member are sealed to each other while holding the low-melting metal therebetween, and the low-melting metal leaking out of the opening part by sealing is in the state confined between the side wall and the projection arranged in parallel with the side wall without flowing into the center part of the substrate. Such a structure of the sealing part widens the joint surface between the side wall and the lid member. On the other hand, oxide films are likely to be formed on the surface of the low-melting metal used as the sealing member and may hinder reliable joints. Therefore, while the projected part is provided, so as to keep the low-melting metal from reaching the center part of the substrate, i.e., the functional part as the device, a surface region of the low-melting metal flows into the container at the time of joining, whereby the low-melting metal having a high purity suitable for sealing can be exposed at a joint part between the side wall and lid member which is the most important for keeping the airtightness. Hence, the airtightness in the vacuum container is secured even when the vacuum container is made smaller.

Effect of the Invention

The vacuum device in accordance with the present invention can sufficiently keep the airtightness in the vacuum container even when made smaller.

EXPLANATIONS OF NUMERALS

Figure 1:
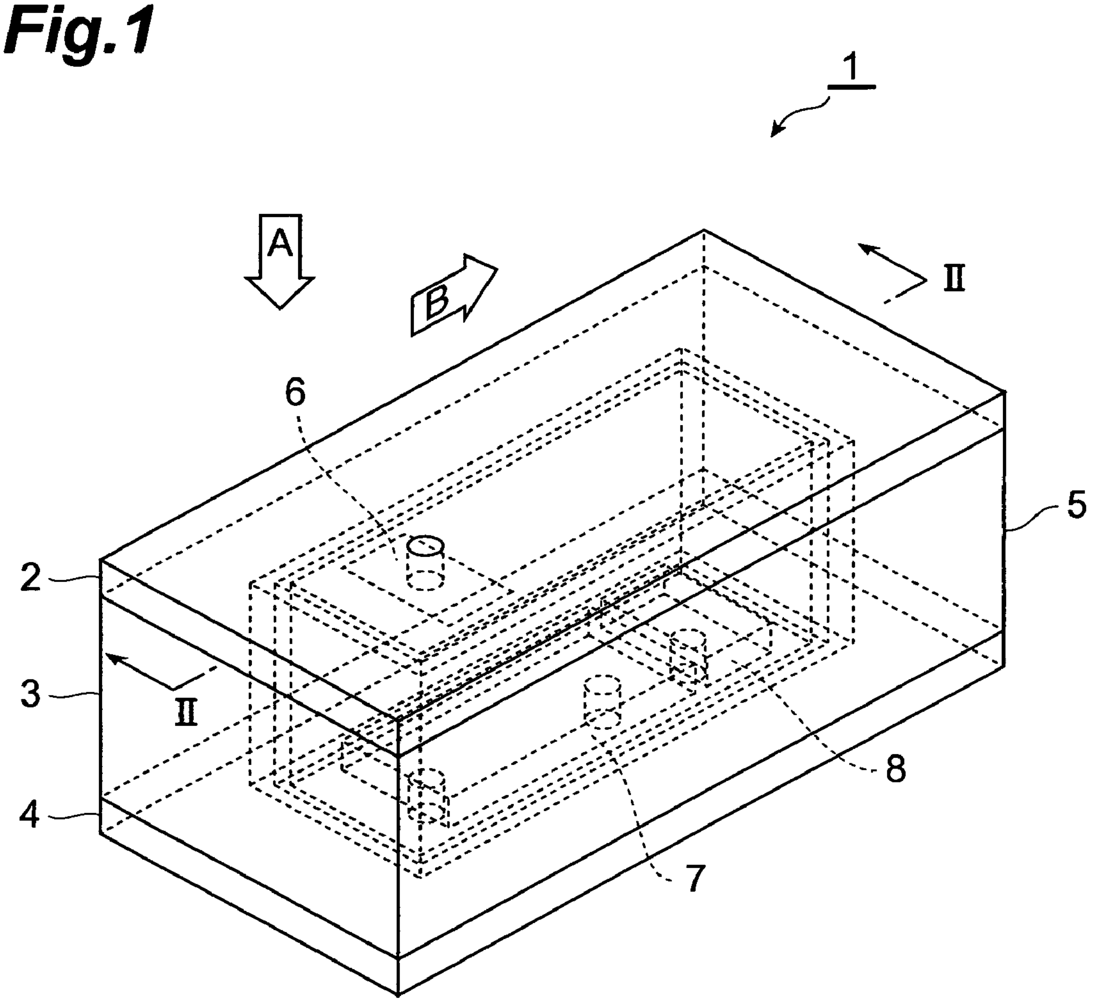
[FIG. 1] A perspective view showing the structure of a photomultiplier tube which is an embodiment of the vacuum device in accordance with the present invention.

1, 41, 51, 61, 71 . . . photomultiplier tube; 2 . . . upper substrate; 3, 3*a*, 3*b* . . . frame (side wall); 4 . . . lower substrate; 14, 54*b*, 62, 72 . . . junction layer; 25*a*, 25*b*, 42*a*, 42*b*, 52*a*, 52*b* . . . projection; 29 . . . depressed part; 63, 64 . . . groove part.

BEST MODES FOR CARRYING OUT THE INVENTION

In the following, preferred embodiments of the vacuum device in accordance with the present invention will be explained in detail with reference to the drawings. In the explanation of the drawings, parts identical or equivalent to each other will be referred to with the same numerals while omitting their overlapping descriptions. Each drawing is made for the sake of explanation and depicted so as to emphasize parts to be explained in particular. Therefore, ratios in dimensions of members in the drawings do not always match those in practice.

FIG. 1 is a perspective view showing the structure of a photomultiplier tube 1 which is an embodiment of the vacuum device in accordance with the present invention. As shown in this drawing, the photomultiplier tube 1 is a transmission type electron multiplier tube having a vacuum container 5 constituted by an upper substrate 2, a frame (side wall) 3, and a lower substrate 4, and is constructed by accommodating a photocathode 6, an electron multiplier part 7, and an anode 8 within the vacuum container 5. This photomultiplier tube 1 is a photomultiplier tube in which the incident direction of light onto the photocathode 6 and the electron traveling direction in the electron multiplier part 7 intersect. Namely, when light is incident on the photomultiplier tube 1 from the direction indicated by arrow A, a photoelectron emitted from the photocathode 6 is incident on the electron multiplier part 7 and travels in the direction indicated by arrow B, thereby multiplying secondary electrons in a cascaded fashion. In the following, the individual constituents will be explained in detail.

Figure 2:
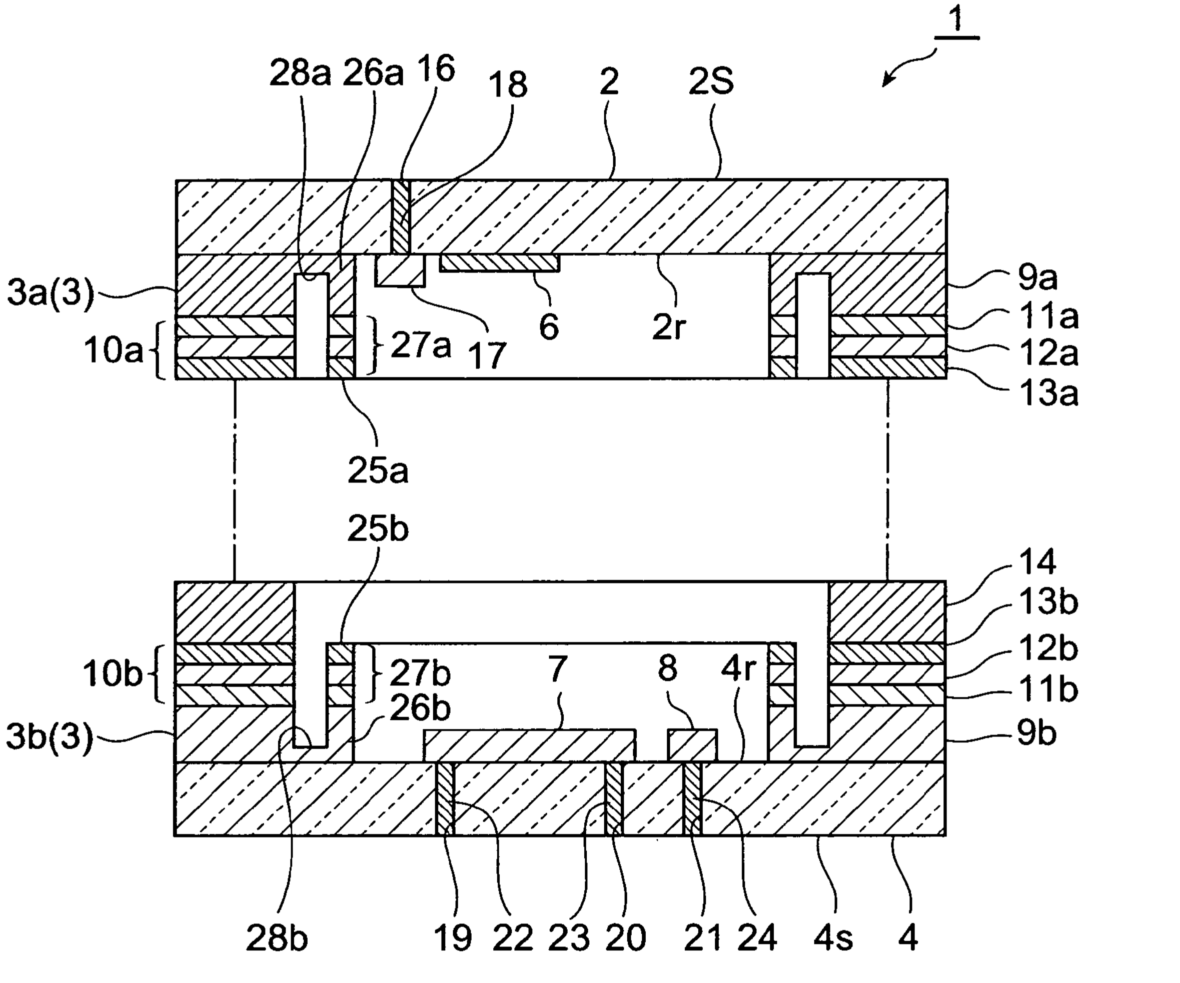
[FIG. 2] An exploded sectional view of the photomultiplier tube 1 taken along the line II-II of FIG. 1.

As shown in FIG. 2 which is an exploded sectional view of the photomultiplier tube 1 taken along the line II-II of FIG. 1, the upper substrate 2 and lower substrate 4 are rectangular flat sheets made of glass each having a size of 15 mm×7 mm, for example, while the frame 3 is constituted by two frame-like members, each having a hollow quadrangular prism form, which are joined together along the substrate surface. The frame-like members are connected to marginal parts of the upper substrate 2 and lower substrate 4 such that the four sides of each substrate are parallel to the four sides of each frame-like member.

Namely, the frame 3 is constituted by frames 3*a* and 3*b* as frame-like members. More specifically, the frame 3*a* connected to the upper substrate 2 has a frame body 9*a* made of silicon (Si) joined to the marginal part of the inner face 2*r* of the upper substrate 2 by anodic bonding and a multilayer metal film 10*a* formed by laminating a metal film 11*a* made of titanium (Ti), a metal film 12*a* made of platinum (Pt), and a metal film 13*a* made of gold (Au) on the frame body 9*a* in this order toward the lower substrate 4. Similarly, the frame 3*b* connected to the lower substrate 4 has a frame body 9*b* made of Si joined to the marginal part of the inner face 4*r* of the lower substrate 4 by anodic bonding and a multilayer metal film 10*b* formed by laminating a metal film 11*b* made of titanium, a metal film 12*b* made of platinum, and a metal film 13*b* made of gold on the frame body 9*b* in this order toward the upper substrate 2. For example, the thicknesses of the metal films are such that the metal films 11*a*, 11*b* are 30 nm each, the metal films 12*a*, 12*b* are 20 nm each, and the metal films 13*a*, 13*b* are 1 μm each. Thus, the frames 3*a*, 3*b* have a structure forming respective openings defined by the end parts of the frame bodies 9*a*, 9*b* on the side opposite from the substrates 2, 4, while the openings are formed with the multilayer metal films 10*a*, 10*b*, respectively.

Further, a frame-like projection 25*b* is provided in parallel with the frame body 9*b* on the inner side of the frame 3*b* on the lower substrate 4. The projection 25*b* is constituted by an Si layer 26*b*, integrally formed with the frame body 9*b*, having substantially the same thickness (height) as that of the frame body 9*b* and a multilayer metal film 27*b*, formed on the Si layer 26*b*, having substantially the same composition and thickness (height) as those of the multilayer metal film 10*b*. This forms such a groove part 28*b* as to travel around the inside of the vacuum container 5 along the edge part of the lower substrate 4 between the frame 3*b* and projection 25*b*. Similarly, a projection 25*a* constituted by an Si layer 26*a* and a multilayer metal film 27*a* is provided on the upper substrate 2, and a groove part 28*a* is formed between the frame 3*a* and projection 25*a*.

The frames 3*a* and 3*b* are joined to each other by holding a joint material containing a low-melting metal such as indium (In) (including In, alloys of In and Sn, alloys of In and Ag, and the like, for example) between the multilayer metal films 10*a* and 10*b*, whereby the inside of the vacuum container 5 is held airtight. Though a joint layer 14 made of the joint material is formed on the multilayer metal film 10*b* in FIG. 2, the joint layer may be formed on the multilayer metal film 10*a* as well.

In such a structure, the upper substrate 2 including the frame 3*a* performs a role as a lid member airtightly sealed to the opening of the frame 3*b*, while the lower substrate 4 and frame 3*b* correspond to the substrate and side wall, respectively, in this case. On the other hand, the lower substrate 4 including the frame 3*b* performs a role as a lid member airtightly sealed to the opening of the frame 3*a*, while the upper substrate 2 and frame 3*a* correspond to the substrate and side wall, respectively, in this case. For this purpose, the multilayer metal films 10*a*, 10*b* are formed at joint parts with the openings of the frames 3*b*, 3*a*, i.e., marginal parts of the substrates 2, 4, respectively.

The frame 3 may be constituted by one member made of Si instead of joining two members of the frames 3*a* and 3*b*. In this case, the frame-like projection is also constituted by one member. Assuming that the substrate, side wall, and lid member are the lower substrate 4, frame 3, and upper substrate 2, respectively, in this case, it will be preferred if the lower substrate 4 (substrate) and frame 3 (side wall) are joined to each other by anodic bonding and then the upper substrate 2 (lid member) having the photocathode 6 and the frame 3 (side wall) are joined to each other by joining the multilayer film and the joint layer to each other. When forming an Si layer 17 electrically connected to the photocathode 6, however, it will be preferred if the frame 3 comprises two members of the frames 3*a* and 3*b*. When the frame 3 comprises two members of the frames 3*a* and 3*b*, it will be preferred in terms of preventing the joint material from flowing into the vacuum container 5 if both of the projections 25*a* and 25*b* are provided, though a projection may be provided on only one member on the side where the joint material flows.

Figure 3:
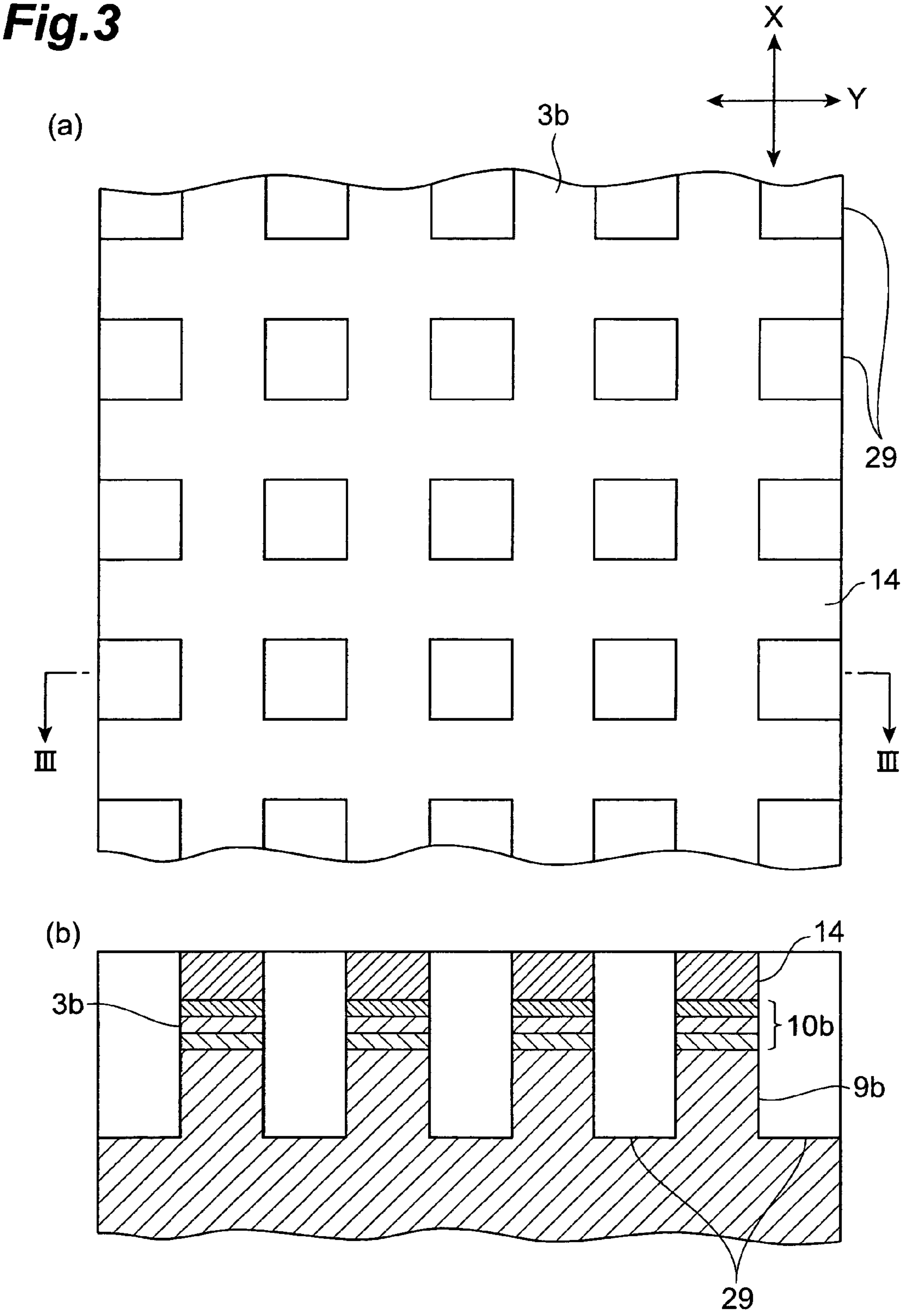
[FIG. 3] A plan view of a frame of FIG. 2 and a sectional view of the frame taken along the line III-III.

Depressed parts may be formed at the joint surface of the frame 3*b* with the frame 3*a* toward the lower substrate 4. FIG. 3 shows the frame 3*b* in the case where the depressed parts are formed, in which area (a) is a plan view of the frame 3*b*, while area (b) is a sectional view of the frame 3*b* taken along the line III-III in area (a). As shown in this drawing, the frame 3*b* is formed with depressed parts 29, each having a quadrangular prism form, arranged two-dimensionally at substantially the same intervals along a direction parallel to the outer edges of the lower substrate 4 (X direction in area (a) of FIG. 3) and a direction perpendicular to the outer edges of the lower substrate 4 (Y direction in area (a) of FIG. 3) in the joint surface. These depressions 29 are formed by being depressed from the surface of the joint layer 14 of the frame 3*b* to the frame body 9*b*, and bottom parts are formed in the frame body 9*b*. Therefore, the joint layer 14 is exposed like a mesh on the joint surface of the frame 3*b*. The depressed parts 29 may also be formed in the joint surface of the frame 3*a* with the frame 3*b*.

Returning to FIG. 2, the inner structure of the vacuum container 5 will be explained.

The inner face 2*r* of the upper substrate 2 in the vacuum container 5 is formed with the transmission type photocathode 6 containing an alkali metal emitting a photoelectron into the vacuum container 5 in response to light incident thereon from the outside. In this case, the upper substrate 2 functions as a transmission window which transmits therethrough toward the photocathode 6 light incident thereon from the outside. The photocathode 6 is formed closer to an end part in the longitudinal direction (lateral direction in FIG. 2) of the inner face 2*r* of the upper substrate 2 along the inner face 2*r*. The upper substrate 2 is formed with a hole 16 penetrating therethrough from a surface 2*s* to the inner face 2*r*, while the Si layer 17 electrically connected to the photocathode 6 is formed on the inner face 2*r* side of the hole 16. A photocathode terminal 18 is arranged in the hole 16, and is electrically connected to the photocathode 6 by electrically coming into contact with the Si layer 17.

On the inner face 4*r* of the lower substrate 4, the electron multiplier part 7 and anode 8 are formed along the inner face 4*r*. The electron multiplier part 7 has a plurality of wall parts erected so as to extend along each other in the longitudinal direction of the lower substrate 4, while a groove part is formed between the wall parts. The side walls and bottom parts of the wall parts are formed with secondary electron emissive surfaces made of a secondary electron emissive material. The electron multiplier part 7 is arranged at a position facing the photocathode 6 within the vacuum container 5. The anode 8 is provided at a position separated from the electron multiplier part 7. The lower substrate 4 is further provided with holes 19, 20, 21 penetrating therethrough from a surface 4*s* to the inner face 4*r*. A photocathode-side terminal 22, an anode-side terminal 23, and an anode terminal 24 are inserted in the holes 19, 20, and 21, respectively. Since the photocathode-side terminal 22 and anode-side terminal 23 are electrically in contact with both end parts of the electron multiplier part 7, respectively, a potential difference can be generated in the longitudinal direction of the lower substrate 4 by applying a predetermined voltage to the photocathode-side terminal 22 and anode-side terminal 23. Since the anode terminal 24 is electrically in contact with the anode 8, electrons having reached the anode 8 can be taken therefrom to the outside as a signal.

Operations of the photomultiplier tube 1 explained in the foregoing will now be explained. When light is incident on the photocathode 6 through the upper substrate 2, a photoelectron is emitted from the photocathode 6 toward the lower substrate 4. The emitted photoelectron reaches the electron multiplier part 7 facing the photocathode 6. Since a potential difference is generated in the longitudinal direction of the electron multiplier part 7 by applying a voltage to the photocathode-side terminal 22 and anode-side terminal 23, the photoelectron having arrived at the electron multiplier part 7 is directed toward the anode 8. Thereafter, the photoelectron having arrived at the electron multiplier part 7 from the photocathode 6 is multiplied in a cascaded fashion while colliding with the side walls and bottom parts of the electron multiplier part 7, thereby reaching the anode 8 while generating secondary electrons. The generated secondary electrons are taken from the anode 8 to the outside through the anode terminal 24.

In the photomultiplier tube 1 explained in the foregoing, the opening part of the frame 3*b* erected on the flat sheet-like lower substrate 4 and the upper substrate 2 provided with the frame 3*a* are sealed to each other while holding the joint layer 14 therebetween, and the joint layer 14 containing the low-melting metal leaking out of the opening part of the frame 3*b* by sealing flows along the frame 3*b*, so as to increase the contact area between the joint layer 14 and the frame 3*b* and be confined into the groove parts 28*a*, 28*b* between the frames 3*a*, 3*b* and the projections 25*a*, 25*b* arranged in parallel with the frames 3*a*, 3*b* without flowing toward the center parts of the substrates 2, 4, i.e., the photocathode 6, electron multiplier part 7, and anode 8. The structure in which a joint material is laminated between the casing-like frames 3*a*, 3*b* widens the joint surface between the substrates 2, 4. Further, the existence of the groove parts 28*a*, 28*b* can prevent operational parts from being influenced by the upper layer part of the joint layer 14 flowing toward the vacuum container 5, if any, in the joining step, and the flow resultantly makes it easier for a high-purity surface of the low-melting metal in the joint layer 14 to be exposed and enables reliable joining. Since the frame bodies 9*a*, 9*b* made of Si are employed as a body of the frame 3, the frame bodies 9*a*, 9*b* themselves are hard to be deformed by the heat at the time of joining and the like. Therefore, the joint layer 14 is hard to become uneven because of deformations of the frame body, so that the joining is done reliably. Thus, the airtightness of the vacuum container 5 is secured reliably even when the vacuum container 5 is made smaller.

Since the projections 25*a*, 25*b* are integrally formed with the frame bodies 9*a*, 9*b*, respectively, the contact areas of the upper substrate 2 and lower substrate 4 with the frame bodies 9*a*, 9*b* become greater, so as to make it possible to secure the airtightness reliably, while making it easier to form the projections 25*a*, 25*b*, whereby the vacuum device can be made efficiently.

Since a plurality of depressed parts 29 are formed in the joint surface of the frame 3*b* with the frame 3*a* or the joint surface of the frame 3*a* with the frame 3*b*, the low-melting metal is easier to flow into the depressed parts 29 at the time of joining and thus is less likely to flow out to the center parts of the substrates 2, 4, and the joint areas increase, whereby the effect of exposing the highly pure surface of the low-melting metal is exhibited in each minute area of the joint surface between the frames 3*a*, 3*b*. The depressed parts 29 are two-dimensionally arranged in the X direction along the joint surface and the Y direction orthogonal to the X direction along the joint surface. As a consequence, the joint surface excluding the depressed parts 29 attains a mesh form, so that the joint material is arranged uniformly and continuously in the X and Y directions in the joint surface, whereby the frames 3*a* and 3*b* are sealed more reliably.

Preferably, the projection is integrally formed with the side wall. When the projection is thus integrally formed with the side wall, the joint area between the substrate and side wall can be made greater, and the vacuum device can be manufactured efficiently.

Further, it will be preferred if at least one of a joint surface of the side wall with the lid member and a joint surface of the lid member with the side wall is formed with a plurality of depressed parts. In this case, the low-melting metal flows out less toward the center part of the substrate at the time of joining, while the joint area increases, and the effect of exposing the highly pure surface of the low-melting metal is exhibited in each minute area of the joint surface.

Furthermore, it will be preferred if the plurality of depressed parts are arranged two-dimensionally in a first direction along the joint surface and a second direction orthogonal to the first direction along the joint surface. Such an arrangement of the depressed parts causes the joint surface excluding the depressed parts to attain a mesh form, so that the low-melting metal is arranged uniformly and continuously in the first and second directions in the joint surface, whereby the side wall and lid member are sealed more reliably to each other.

Also, it will be preferred if there are a plurality of projections. The plurality of projections more reliably prevent the low-melting metal from flowing into the center part of the substrate.

Further, it will be preferred if a projection other than that formed on the innermost side in the plurality of projections is airtightly joined to the lid member while holding the low-melting metal therebetween. In this case, the joint of the lid member is multiplied, so as to realize more reliably airtight joint.

Furthermore, it will be preferred if the plurality of projections are airtightly joined to the lid member while holding the low-melting metal therebetween, and the width of the projection formed on the inner side in a direction along the inner face of the substrate is smaller than the width of the projection formed on the outer side in the direction along the inner face. Such a structure can reduce the amount of gases released from the low-melting metal on the projection on the inner side, secure the joint area in the outer projection, and realize a reliable joint while restraining the gases from entering the inside.

It will also be preferred if the projection has a groove part communicating a space surrounded by the projection with a space on the outside of the projection. Providing such a groove can make the airtightness on the inside higher by letting out the gases generated by the joint.

Figure 4:
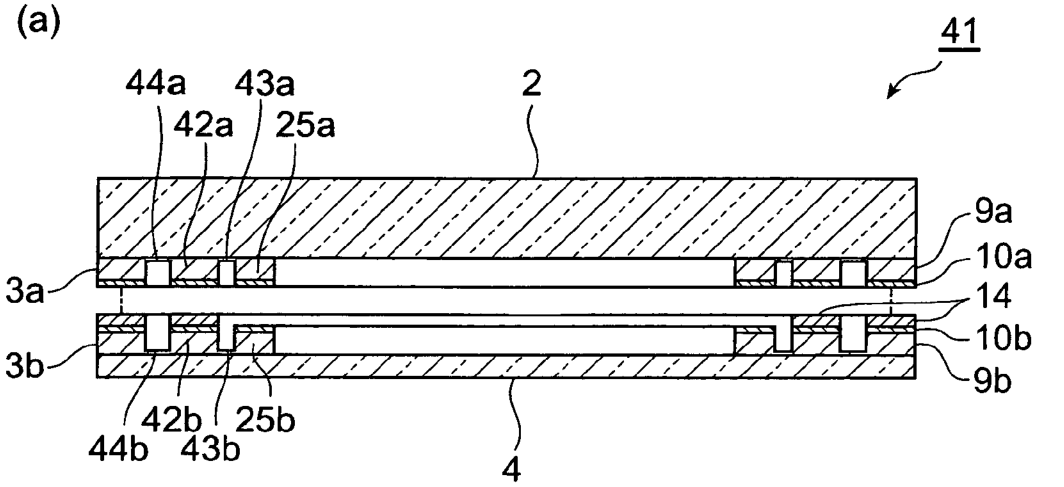
[FIG. 4] An exploded sectional view of a photomultiplier tube which is a modified example of the present invention and a plan view thereof on the lower substrate side.
Figure 4:
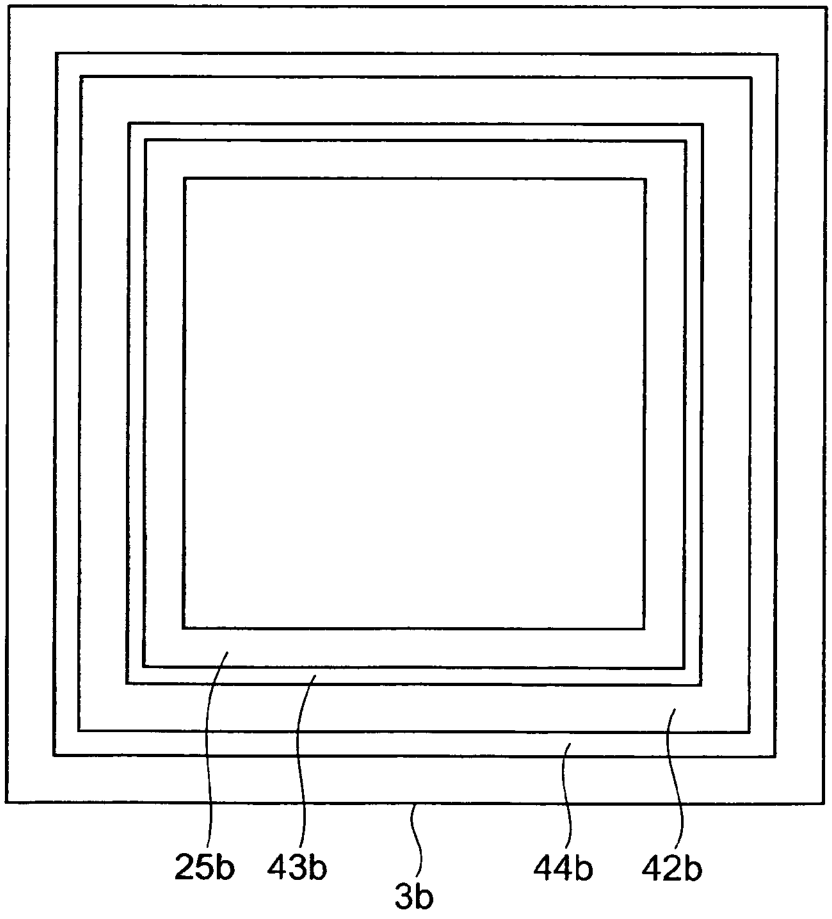

The present invention is not limited to the embodiment mentioned above. For example, the number of frame-like projections formed on the upper substrate 2 or lower substrate 4 is not limited to any specific number. In FIG. 4, area (a) is an exploded sectional view of a photomultiplier tube 41 which is a modified example of the present invention, while area (b) is a plan view of the lower substrate 4 in area (a). Here, operational parts such as photocathode are not depicted. The photomultiplier tube 41 shown in this drawing has a projection 42*b* with substantially the same thickness (height) and multilayer structure as those of the frame 3*b* between the frame 3*b* and projection 25*b*, while grooves 43*b* and 44*b* are formed between the projections 42*b* and 25*b* and between the projection 42*b* and frame 3*b*, respectively. Namely, the joint layer 14 is formed on the projection 42*b* that is located on the outer side of the projection 25*b*. Also, a projection 42*a* having substantially the same thickness (height) and multilayer structure as those of the frame 3*a* is provided between the frame 3*a* and projection 25*a*, while grooves 43*a* and 44*a* are formed between the projections 42*a* and 25*a* and between the projection 42*a* and frame 3*a*, respectively. In such a photomultiplier tube 41, the projections 42*a* and 42*b* are airtightly joined to each other while holding the low-melting metal therebetween when joining the frames 3*a* and 3*b* to each other, whereby the joint is multiplied, so as to realize more reliably airtight joint. In this case, the joint material flows into the grooves 43*b*, 44*b* and 43*a*, 44*a*, and thus can be prevented from entering the vacuum container.

As will be explained in the following, frame-like projections on the substrates 2, 4 may be formed with joint layers, or the joint layers on a plurality of projections may be varied in terms of thickness.

Figure 5:
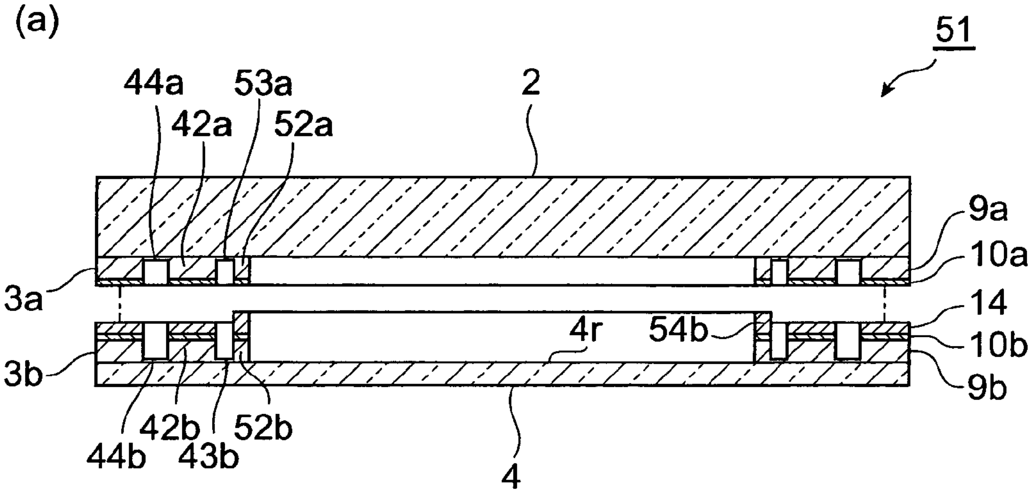
[FIG. 5] An exploded sectional view of a photomultiplier tube which is another modified example of the present invention and a plan view thereof on the lower substrate side.
Figure 5:
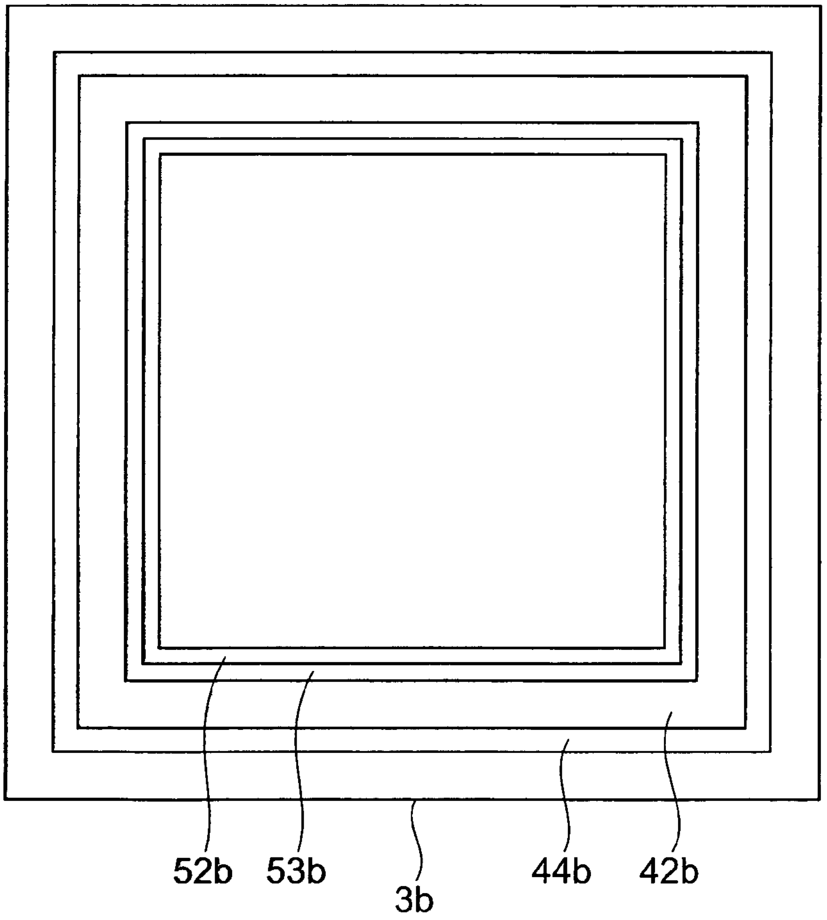

In FIG. 5, area (a) is an exploded sectional view of a photomultiplier tube 51 which is another modified example of the present invention, while area (b) is a plan view of the lower substrate 4 in area (a). As in FIG. 4, operational parts such as photocathode are not depicted. In the photomultiplier tube 51, a frame-like projection 52*b* having the same multilayer structure as that of the frame 3*b* is formed on the inner side of the projection 42*b*. The projection 52*b* is formed with a joint layer 54*b* having a thickness greater than the joint layer 14 of the frame 3*b*, while the width of the projection 52*b* in a direction along the inner face 4*r* of the lower substrate 4 is made smaller as compared with those of the frame 3*b* and the projection 42*b* on the outer side of the projection 52*b*.

When the upper substrate 2 and lower substrate 4 are joined to each other by pressing them against each other at the time of joining the upper substrate 2 and lower substrate 4 to each other in such a photomultiplier tube 51, the projections 52*a* and 52*b* are initially joined together by coming into contact with each other. Further pressing deforms the joint layer 54*b* on the projection 52*b*, thereby bringing the projection 42*a* and frame 3*a* into contact with the projection 42*b* and frame 3*b*, respectively, and thus joining them to each other. Here, the joint layer 54*b* has such a smaller width as to yield a less amount of gas at the time of joining and thus can reduce the gas flow into the vacuum container 5, whereas the projection 42*b* and frame 3*b* have relatively large widths and thus can sufficiently keep the airtightness in the vacuum container 5. On the other hand, the gas generated when joining the projection 42*b* and frame 3*b* to each other does not flow into the vacuum container 5 due to bonding of the projection 52*b*, whereby an improvement in the degree of vacuum and the maintenance of airtightness can be achieved at the same time within the vacuum container 5.

Figure 6:
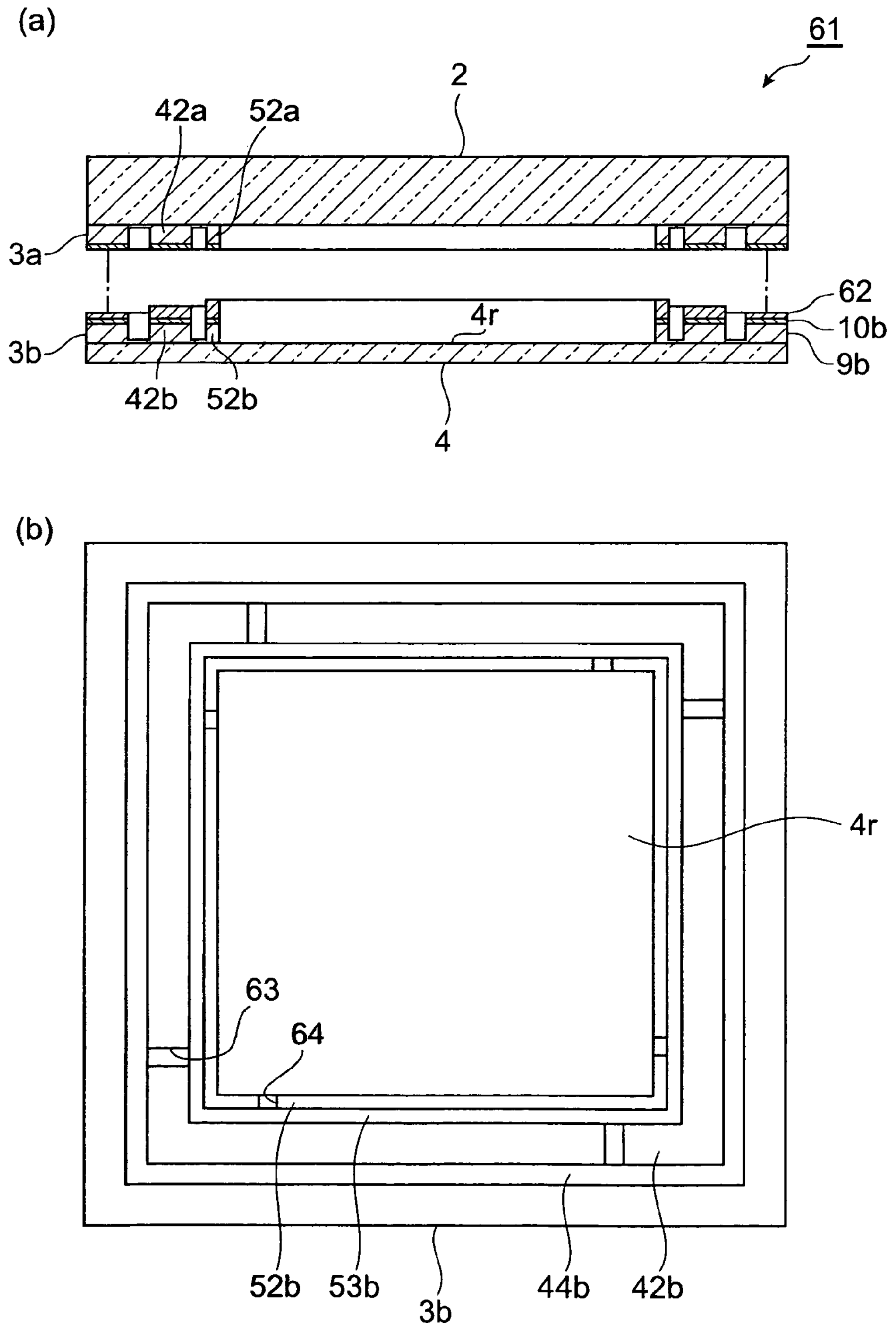
[FIG. 6] An exploded sectional view of a photomultiplier tube which is still another modified example of the present invention and a plan view thereof on the lower substrate side.

In FIG. 6, area (a) is an exploded sectional view of a photomultiplier tube 61 which is still another modified example of the present invention, while area (b) is a plan view of the lower substrate 4 in area (a). As in FIG. 4, operational parts such as photocathode are not depicted. In the photomultiplier tube 61, as compared with the photomultiplier tube 51, the thickness of the joint layer 62 formed on the frame 3*b* is made smaller than that of the projection 42*b*, so that the thickness of the joint material on the lower substrate 4 successively decreases toward the marginal part. The projections 42*b* and 52*b* are formed with gas-exhausting grooves 63 and 64 which communicate the inner spaces surrounded by the projections 42*b*, 52*b* on the inner face 4*r* of the lower substrate 4 with the spaces on the outer side of the projections 42*b*, 52*b*, respectively.

Figure 7:
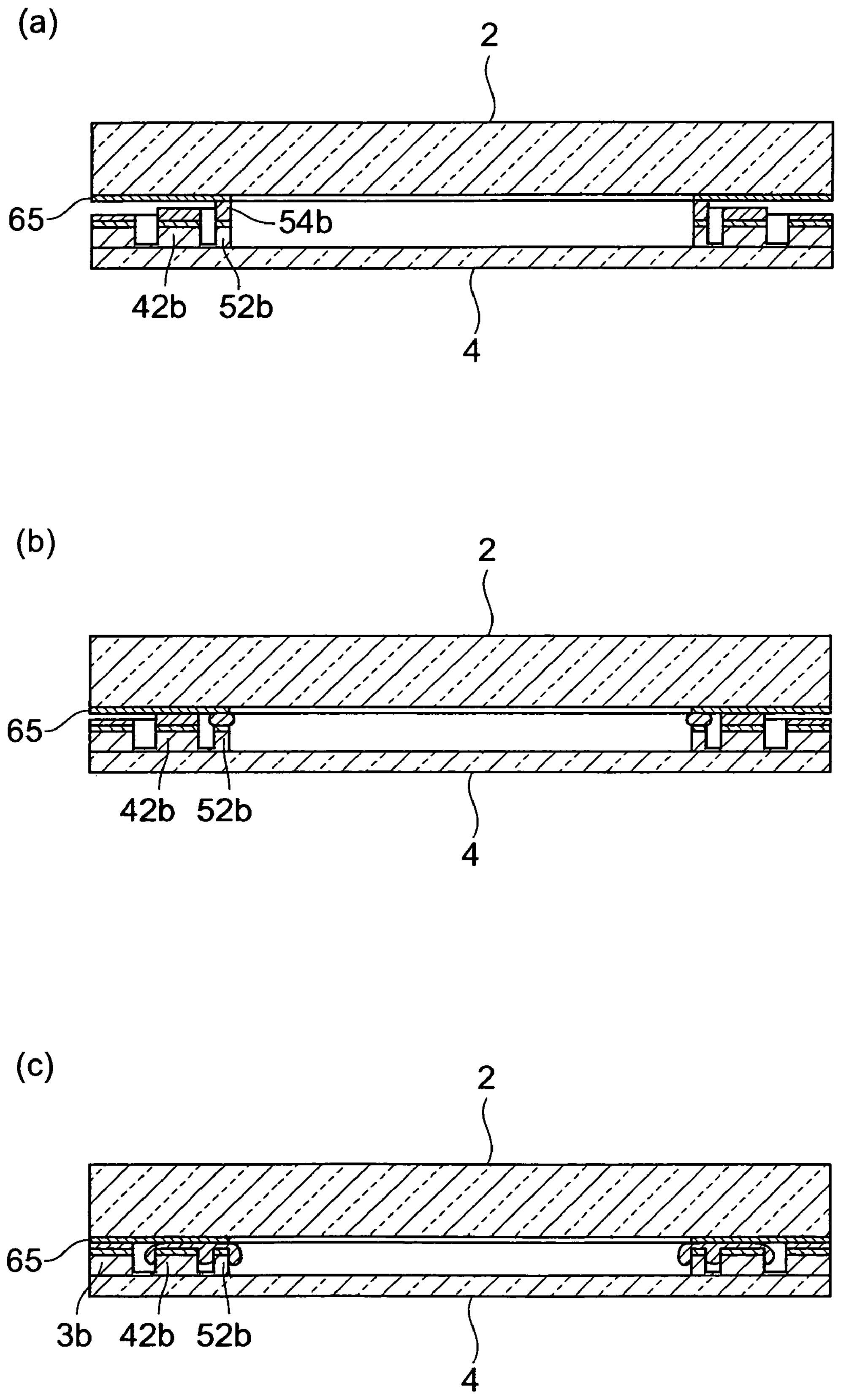
[FIG. 7] A view explaining a procedure of joining a vacuum container in the photomultiplier tube of FIG. 6.

FIG. 7 is a view explaining a procedure of joining the vacuum container 5 in the photomultiplier tube 61. Here, a joining procedure in the case where a multilayer meal film is directly formed on the upper substrate 2 is shown for the sake of convenience. As shown in this drawing, when the upper substrate 2 and lower substrate 4 are joined together by pressing them against each other while keeping ventilation in the groove part 64, the projection 52*b* and the multilayer metal film 65 on the upper substrate 2 are initially joined together by coming into contact with each other (area (a) in FIG. 7). Here, the gas generated by the joint is let out through the groove part 64. As the upper substrate 2 and lower substrate 4 are further pressed while keeping ventilation in the groove part 63, the groove part 64 is blocked by the joint material invaded from the upper side of the projection 52*b* at the same time when the joining of the projection 42*b* and upper substrate 2 is started, whereby the inside of the vacuum container 5 is held in high vacuum (area (b) in FIG. 7). Here, the gas generated by the joint is let out through the groove part 63. When the upper substrate 2 and lower substrate 4 are further pressed, the groove part 63 is blocked by the joint material at the same time when the frame 3*b* and upper substrate 2 are joined to each other, whereby the joining with the projections 42*b*, 52*b* and the whole surface of the frame 3*b* is completed (area (c) in FIG. 7). Such a structure of the photomultiplier tube 61 reliably performs the joining and gas exhaust successively from the inner side of the vacuum container 5, thereby making it possible to promote efficiency in manufacturing steps and improve the degree of vacuum within the vacuum container 5.

Figure 8:
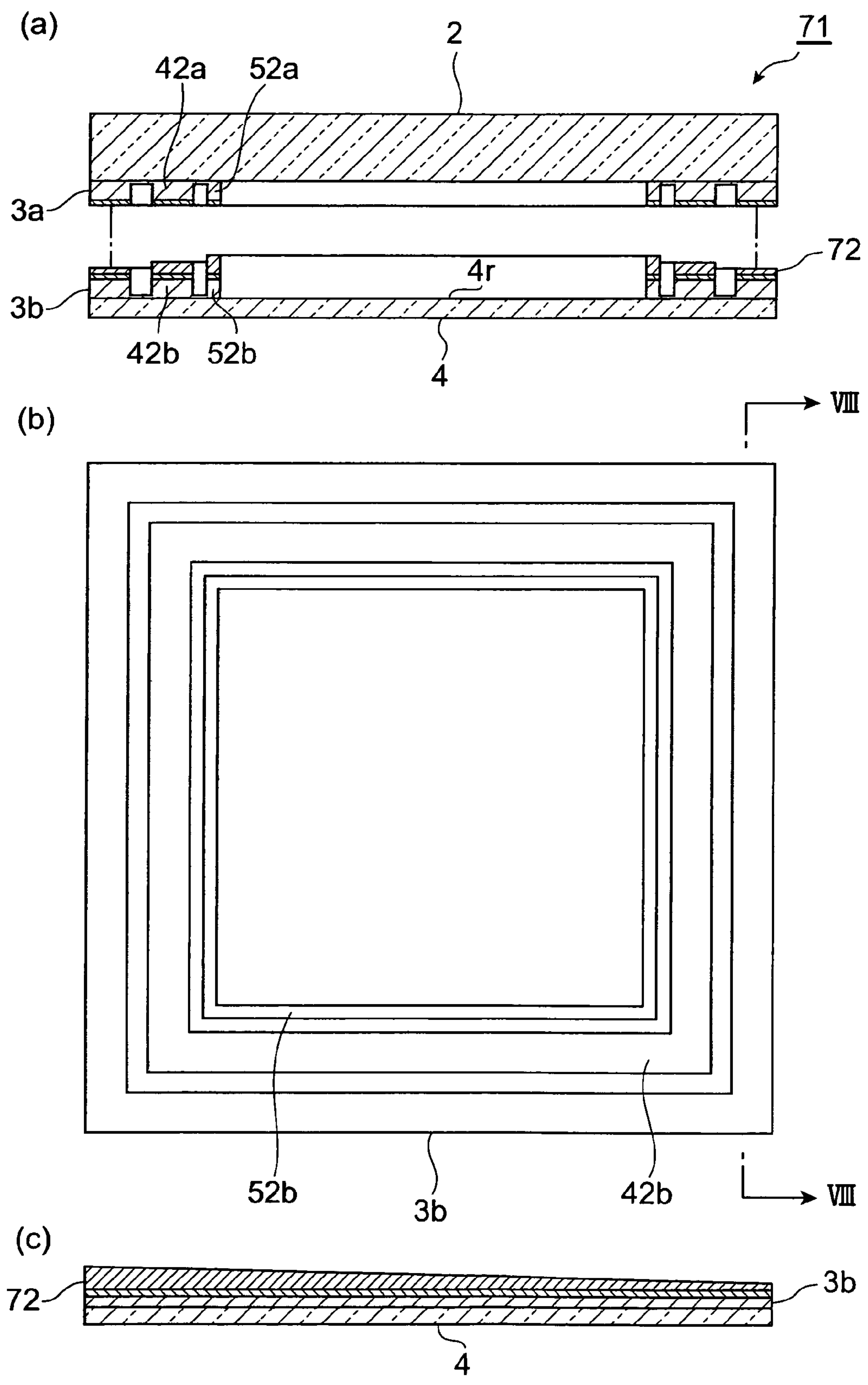
[FIG. 8] An exploded sectional view of a photomultiplier tube which is still another modified example of the present invention, a plan view thereof on the lower substrate side, and a sectional view of the lower substrate including a frame taken along the line VIII-VIII.

The thickness of the joint layer formed on the frame-like projections or frames on the substrates 2, 4 may be changed gradually or stepwise along the marginal parts of the substrates 2, 4. In FIG. 8, area (a) is an exploded sectional view of the photomultiplier tube 71 in such a case, area (b) is a plan view of the lower substrate 4 in area (a), and area (c) is a sectional view taken along the line VIII-VIII of area (b). As in FIG. 4, operational parts such as photocathode are not depicted. As shown in this drawing, the joint surface of the frame 3*b* is formed with a joint layer 72 whose thickness changes substantially linearly along the marginal part of the lower substrate 4. The joint layer 72 is formed such that its thickness changes linearly along a direction around the marginal part of the lower substrate 4. This can shift the joining timing in the direction around the marginal part of the lower substrate 4 when joining the frames 3*a* and 3*b* to each other, whereby the inside of the vacuum container 5 can be kept in high vacuum while efficiently letting out the gas generated by the joint.

Though the vacuum devices of the above-mentioned embodiments are photomultiplier tubes, the present invention is applicable to various vacuum devices. For example, it can be applied to electron tubes such as phototubes having no electron multiplier parts, discharge tubes encapsulating specific gases therein, vacuum devices incorporating electron guns therein, ionizers, light-emitting/light-detecting devices manufactured in semiconductor processes such as display tubes, LED, PD, CCD, and organic EL, and semiconductor devices and the like whose functions improve when the inside is made vacuum or a specific gas is encapsulated in the inside, e.g., PDP (Plasma Display Panel), MEMS (Micro Electro Mechanical Systems) type pressure sensors, MEMS type shock sensors, MEMS type mirror devices, MEMS type optical choppers, and the like.

INDUSTRIAL APPLICABILITY

The present invention relates to a vacuum device having a vacuum-sealed package, a sealing structure of the package in the vacuum device in particular, and makes it possible to sufficiently keep the airtightness in a vacuum container even when it is made smaller.

The invention claimed is:

1. A vacuum device comprising:
a flat sheet-like substrate;
a frame-like side wall erected on the substrate;
a lid member airtightly joined to an opening part of the side wall while holding a low -melting metal therebetween; and
a frame-like projection arranged in parallel with the side wall on the inner side of the side wall on the substrate,
wherein at least one of a joint surface of the side wall with the lid member and a joint surface of the lid member with the side wall is formed with a plurality of depressed parts.

2. A vacuum device according to claim 1, wherein the projection is integrally formed with the side wall.

3. A vacuum device according to claim 1, wherein the plurality of depressed parts are arranged two-dimensionally in a first direction along the joint surface and a second direction orthogonal to the first direction along the joint surface.

4. A vacuum device according to claim 1, wherein the projection is provided in a plurality.

5. A vacuum device according to claim 4, wherein a projection other than that formed on the innermost side in the plurality of projections is airtightly joined to the lid member while holding the low-melting metal therebetween.

6. A vacuum device according to claim 4, wherein the plurality of projections are airtightly joined to the lid member while holding the low-melting metal therebetween, the width of the projection formed on the inner side in a direction along the inner face of the substrate being smaller than the width of the projection formed on the outer side in the direction along the inner face.

7. A vacuum device according to claim 1, wherein the projection has a groove part communicating a space surrounded by the projection with a space on the outside of the projection.

8. A vacuum device comprising:
a flat sheet-like substrate;
a frame-like side wall erected on the substrate; and
a lid member airtightly joined to an opening part of the side wall while holding a low -melting metal therebetween;
wherein at least one of a joint surface of the side wall with the lid member and a joint surface of the lid member with the side wall is formed with a plurality of depressed parts, and the plurality of depressed parts are arranged two-dimensionally in a first direction along the joint surface and a second direction orthogonal to the first direction along the joint surface.

9. A vacuum device according to claim 8, wherein
the side wall is made of silicon,
an inner face of the lid member is formed with a photocathode,
an electron multiplier part is arranged at a position on an inner face of the substrate facing the photocathode, and
the vacuum device is a photomultiplier tube in which an incident direction of light onto the photocathode and an electron traveling direction in the electron multiplier part intersect.

10. A vacuum device comprising:
a flat sheet-like substrate;
a frame-like side wall erected on the substrate; and
a lid member airtightly joined to an opening part of the side wall while holding a low -melting metal therebetween,
wherein at least one of a joint surface of the side wall with the lid member and a joint surface of the lid member with the side wall is formed with a plurality of depressed parts,
the side wall is made of silicon,
an inner face of the lid member is formed with a photocathode,
an electron multiplier part is arranged at a position on an inner face of the substrate facing the photocathode,
the vacuum device is a photomultiplier tube in which an incident direction of light onto the photocathode and an electron traveling direction in the electron multiplier part intersect, and
the electron multiplier part is separated from the side wall.

11. A vacuum device according to claim 10, wherein the plurality of depressed parts are arranged two-dimensionally in a first direction along the joint surface and a second direction orthogonal to the first direction along the joint surface.

* * * * *